Oct. 17, 1972 E. R. BLOME 3,698,928

MULTILAYER ANTIREFLECTIVE ABSORPTION FILM

Filed Nov. 14, 1967

EUGENE R. BLOME
INVENTOR

BY Gordon H Telfer
Stuart Lubitz
ATTORNEYS

United States Patent Office 3,698,928
Patented Oct. 17, 1972

3,698,928

MULTILAYER ANTIREFLECTIVE ABSORPTION FILM

Eugene R. Blome, San Jose, Calif., assignor to Fairchild Camera and Instrument Corporation, Syosset, N.Y.

Filed Nov. 14, 1967, Ser. No. 682,842
Int. Cl. G02b *1/10*
U.S. Cl. 117—45 1 Claim

ABSTRACT OF THE DISCLOSURE

A multilayer antireflective absorption mask comprising a transparent substrate having a first layer of oxidized chromium with the thickness adapted to selectively absorb reflected radiation that would be sensed by the eye (e.g., 5000 to 6000 angstroms); a layer of chromium masking material having a thickness adapted to absorb radiation that would expose a photoresist (e.g., 3000 to 6000 angstroms) and a second layer of oxidized chromium having a thickness adapted to selectively absorb reflected radiation that would exposed a photoresist (e.g., 3500 to 4500 angstroms). The light otherwise reflected and transmitted through the substrate is selectively absorbed by the first layer of oxidized chromium and the non-reflected transmitted light is absorbed by the layer interposed between the two oxidized chromium layers. Light that reaches a reflector, via transparent areas of the multilayered mask (such as a semiconductor device with a photo-resist thereon) that is reflected thereby, is selectively absorbed by the second oxidized chromium layer.

BACKGROUND OF THE INVENTION

(1) Field of the invention

Thi invention relates to multilayer antireflective absorption films for high-resolution masking. More particularly, this invention relates to multilayer oxidized chromium-chromium-oxidized chromium films for micogeometry masking.

(2) Description of the prior art

The photo masks employed by the prior art are designed to make possible the light polymerization of selected portions of light-sensitive layers (of photopolymers) placed upon a semiconductor surface. These masks have been made from metal (e.g., chromium), black emulsions, and other materials. One problem inherent in metal masks is that light reflecting from the semiconductor surface strikes the face of the mask that is adjacent to the semiconductor surface and then is reflected down at an angle. This causes the original geometry that was to be transferred by the mask to become blurred with attendant low resolution. The reflectivity of the semiconductor surface and mask is one of the mechanisms that causes photoresist line closures, which are normally referred to as "bridging." The closure of lines does not permit reliable, reproducible photomasking or etching of microgeometry, close-tolerance, soid-state devices. The black-emulsion mask is one prior art attempt to resolve this problem. These masks, however, are disadvantageous because when contact is made between the black emulsion and the semiconductor device, the emulsion tends to wear. Also, the granular structure of the black emulsion does not provide high enough resolution.

SUMMARY OF THE INVENTION

Briefly, the multilayer light mask comprises a transparent substrate; a layer of masking material is interposed between light absorbing layers adjacent the masking material. The light absorbing layers are adapted to absorb light of a predetermined wave length. Both the absorbing layers and the masking material are formed into a predetermined pattern.

The novel features which are believed to be characteristic of the invention, both as to its organization and method of operation, together with further objects and advantages thereof will be better understood from the following description considered in connection with the accompanying drawings in which a presently preferred embodiment of the invention is illustrated by way of example. It is to be expressly understood, however, that the drawing is for the purpose of illustration and description only, and is not intended as a definition of the limits of the invention.

DESCRIPTION OF THE PREFERRED EMBODIMENT

Figure 1:
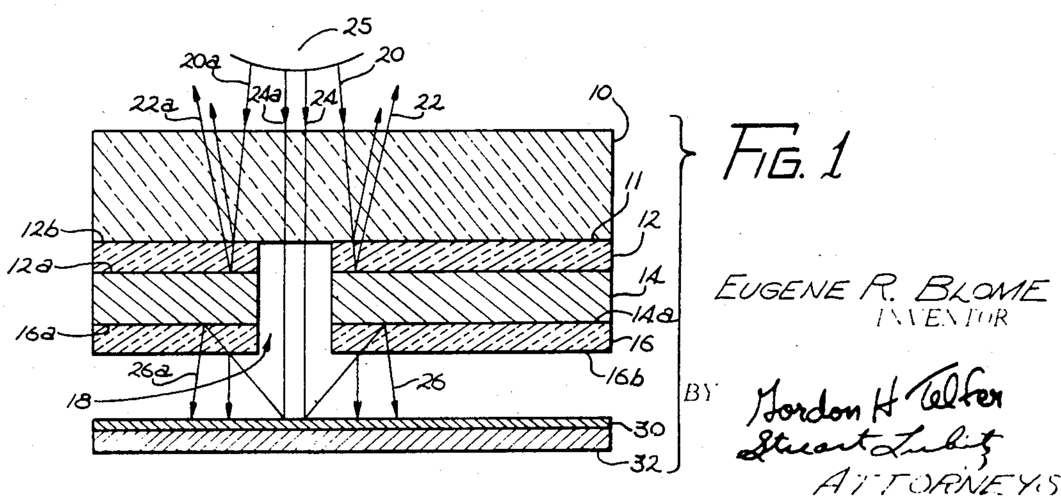
FIG. 1 is a diagrammatic sectional elevation view of an embodiment of the invented mask.

Referring to FIG. 1, substrate material 10 can be a plate of transparent glass having a bottom side 11. The glass plate has polished surfaces, which enhance the optical quality. The thickness of the glass plate is also carefully controlled and in the preferred embodiment the glass plate is 0.063±0.005 inch thick. The transparent substrate 10 is adapted to allow ultraviolet, violet, blue and other visible light from a mercury light source to pass therethrough from its top surface through the bottom surface 11.

Deposited upon the lower surface 11 of the substrate material 10 is a first layer 12 of a light-absorbing film. The type of material deposited and its thickness can be varied so that light of at least a predetermined wave length is absorbed. First layer 12 is deposited on a surface 11 of glass substrate 10 in such a manner that a predetermined pattern is formed having an open area 18. Thus, light travelling along path 24 and 24*a* passes unimpeded through the substrate 10 and the remainder of the mask to a reflector 30, such as the surface of a semiconductor device. Light passing through substrate 10 in areas other than area 18 is substantially absorbed by film 12, at least in the range of the predetermined wave length. The material of first layer 12 is selected so that light in at least the visible spectrum and possibly in the mercury-vapor spectrum from 3500 to 6000 angstroms is selectively absorbed. The preferred materials for light-absorbing layer 12 are oxidized chromium, or nickel-chromium oxidized film, or $SiO_2$-MgO-Cr or $Cr_2O_3$ films. In the preferred embodiment of the invention, an oxidized chromium film is employed having a thickness of approximately 500 to 700 angstroms.

In order to absorb the desired wave lengths, the oxidized chromium layer 12 must be deposited to a predetermined thickness, because the thickness of the material affects the absorption characteristic of the film. Film 12 can be deposited to a thickness ranging from 500 to 3000 angstroms. It has been found that especially excellent results are obtained when the film is deposited to a thickness of 600 angstroms. The correct film thickness is determined upon deposition by observing a visual blue color of the deposited oxidized chromium film. When this condition occurs, the film has a spectral reflectivity of approximately 10 to 40 percent.

Referring again to FIG. 1, a layer 14 of masking material is formed adjacent first layer 12. The masking material is preferably a metal film of a selected uniform thickness. In the preferred embodiment, the film is chromium metal. The function of the film 14 is to provide an opaque mask and to provide a bonding surface for those films to give the multilayer film cohesiveness and structural stability. A convenient thickness for layer 14 is approximately 1575 angstroms.

A second layer 16 of light absorbing material is located on front surface 14*a* of masking material 14. The second layer 16 can be any of the light absorbing films mentioned above, but in the presently preferred embodiment of the invention, it is oxidized chromium. Second layer 16 is deposited in a pattern identical to layers 12 and 14. Light from light source 25 passes through transparent substrate 10 through area 18 and strikes a photoresist layer 30. The light striking photoresist 30 is reflected to layer 16 adapted to selectively absorb light which would expose photoresist 30. Preferably wave lengths of approximately 3650 to 4358 angstroms are absorbed by film 16. Light of other wave lengths may also be absorbed by film 16. Light of other wave lengths may be reflected back from surface 16*a* of film 16, such as rays 26 and 26*a*.

In order to efficiently absorb light of the specified wave length in the mercury vapor region, second layer 16 is deposited to a thickness in the range of 250 to 350 angstroms. In the presently preferred embodiment of the invention, an oxidized chromium is deposited to a thickness of approximately 300 angstroms. The proper thickness has been obtained when visually a yellow color of layer 16 is observed. When the yellow color is observed, film 16 has a spectral reflectivity of less than 9 percent reflection at 3500 to 4500 angstroms. This is a great improvement over the reflectivity of black emulsion masks, which have a reflectivity of approximately 10 percent or higher.

In operation, the mask is aligned and then placed in contact with a photoresist layer 30 on a semiconductor device substrate 32. A mercury light source 25 provides light along path 24 and 24*a* which passes through transparent substrate 10, unimpeded through area 18 in the films, and strikes the surface of photoresist 30. The light rays striking photoresist 30 are reflected upwardly and strike second layer 16, which absorbs light having the prescribed wave length. Light of the other wave lengths is reflected back to photoresist 30, by paths 26*a* and 26. It is these reflections which in prior art devices cause blurring of the image or bridging in the photoresist 30. However, in the present mask, light that would cause bridging of the photoresist layer has been absorbed by layer 16, and therefore bridging is controlled. Light from a filtered mercury or tungsten light source passing along paths 20 and 20*a* passes through transparent substrate 10 and is absorbed by layer 12. Only a small percentage of the filtered light is reflected back to the surface via the paths 22*a* and 22. Controlling the visual reflection of the back surface in this manner makes possible much higher resolution and easier optical alignment of the mask by the operator in the initial stages of the procedure.

Figure 2:
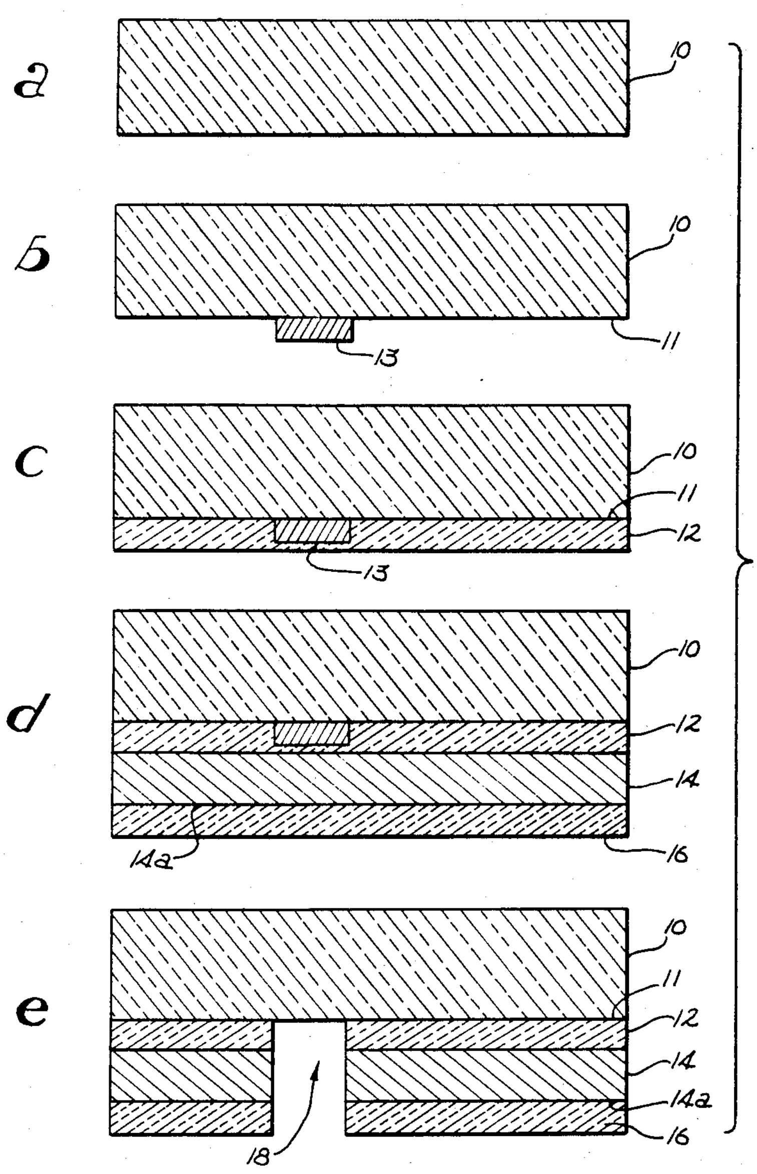
FIGS. 2*a*–2*e* show the steps of the process of fabricating the invented mask.

Referring now to FIGS. 2*a* through 2*e*, there is shown the method whereby the invented multilayer mask is fabricated. First, a transparent substrate 10 of a predetermined thickness is provided with clean and optically flat surfaces. Next, a desired pattern of photoresist 13 is provided on surface 11 of substrate 10. This pattern is such that subsequent metal oxide layers may be deposited thereover. Standard photoresist techniques are used for this step and when unpolymerized photoresist is removed, the substrate is ready for the metal-oxide evaporation step (FIG. 2*b*).

Next, a layer of light absorbing material (e.g., oxidized chromium) is vacuum deposited on surface 11 (FIG. 2*c*). The oxidized chromium layer may be deposited to a thickness range of 500 to 3000 angstroms, depending on the wave length of light it is to absorb. In the present invention, layer 12 is deposited to a thickness of approximately 600 angstroms. The end point of the deposition is achieved when layer 12 has a visually blue color. At this point layer 12 has a spectral reflectivity of approximately 10 to 40 percent in the spectral area of 5000 to 6000 angstroms.

Next, a layer 14 of metal masking material is deposited upon layer 12 of light-absorbing material (FIG. 2*d*). In the presently preferred embodiment of the invention, the metal employed is chromium, which is deposited to a thickness of approximately 1575 angstroms. Finally, a layer 16 of chromium oxide is deposited on surface 14*a* of layer 14 (FIG. 2*d*). Layer 16 preferably comprises oxidized chromium that is vacuum evaporated and deposited to a thickness in the range of between 250 to 350 angstroms. It has been found that when the film is to absorb light in the wave length of 3650 to 4358 angstroms, a thickness of approximately 300 angstroms is required. It has been observed that the end point of this deposition is attained when the oxidized-chromium film is a visual light-yellow color. At this point the spectral reflectivity of the film is less than 9 percent at 3500 to 4500 angstroms. Thus, layer 16 is adapted to absorb light reflected from the surface of reflector 30 at the above referenced wave length, which wave lengths would otherwise polymerize photoresist layer 30.

The mask is formed into the desired configuration by stripping or lifting the photoresist (FIG. 2*e*). This is performed in accordance with well-known techniques. The resulting mask is shown in FIG. 2*e*.

It is apparent from the foregoing that the multilayer antireflective mask selectively absorbs the light from the mercury light wave length and the visible region. This permits maximum contrast, resolution, and operation efficiency. Using this mask, there is no longer any closure of lines or bridging in the photoresist layer. Thus, it is possible to fabricate reliable, reproducible solid-state devices of close-tolerance microgeometry. Another advantage of the invented film is that the reflectivity of the front face is less than 9 percent in the spectral area of 3500 to 4500 angstroms. This is less than the standard black emulsion mask and yet the invented mask has greater durability and scratch resistance.

Although this invention has been disclosed and illustrated with reference to particular applications, the principles involved are susceptible of numerous other applications which will be apparent to persons skilled in the art.

I claim:

1. A multilayer mask comprising:

a transparent substrate containing a first face and a second face parallel to said first face, said transparent substrate allowing ultraviolet, violet, blue and other visible light from a mercury light source to pass through it from said first face to said second face;

a multilayer opaque coating on said second face of said substrate, said opaque coating covering only selected portions of said second face thereby to form an opaque pattern thereon, leaving transparent, complementary portions of said substrate, said multilayer opaque coating comprising:

a first layer of selectively light-absorbing material adherent to and overlying said second face, said first layer comprising an oxidized chromium film having a thickness between approximately 500–

700 angstroms such that said first layer appears blue;

a second layer of opaque material adherent to and overlying said first layer, said second layer comprising a chromium metal film with a thickness of approximately 1575 angstroms; and a third layer of selectively light-absorbing material adherent to and overlying said second layer, said third layer comprising an oxidized chromium film having a thickness in the range of 250–350 angstroms such that said third layer appears yellow.

References Cited

UNITED STATES PATENTS

| | | | |
|---|---|---|---|
| 3,004,875 | 10/1961 | Lytle | 17—33.3 X |
| 2,999,034 | 9/1961 | Heidenhain | 117—71 X |
| 2,858,240 | 10/1958 | Turner et al. | 117—33.3 X |
| 2,854,349 | 9/1958 | Dreyfos et al. | 117—71 |

ALFRED L. LEAVITT, Primary Examiner

U.S. Cl. X.R.

117—71 R, 124 B, 124 C